US012165981B2

(12) United States Patent
Loh et al.

(10) Patent No.: US 12,165,981 B2
(45) Date of Patent: Dec. 10, 2024

(54) 3D SEMICONDUCTOR PACKAGE WITH DIE-MOUNTED VOLTAGE REGULATOR

(71) Applicant: ADVANCED MICRO DEVICES, INC., Santa Clara, CA (US)

(72) Inventors: Gabriel H Loh, Santa Clara, CA (US); Raja Swaminathan, Santa Clara, CA (US); Rahul Agarwal, Santa Clara, CA (US); Brett P. Wilkerson, Santa Clara, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 103 days.

(21) Appl. No.: 17/556,346

(22) Filed: Dec. 20, 2021

(65) Prior Publication Data

US 2023/0197619 A1    Jun. 22, 2023

(51) Int. Cl.
*H01L 23/538* (2006.01)
*G05F 1/575* (2006.01)
*H01L 25/065* (2023.01)
*H01L 27/06* (2006.01)

(52) U.S. Cl.
CPC .......... *H01L 23/5384* (2013.01); *G05F 1/575* (2013.01); *H01L 23/5385* (2013.01); *H01L 23/5386* (2013.01); *H01L 25/0657* (2013.01); *H01L 27/0688* (2013.01)

(58) Field of Classification Search
CPC ............. H01L 23/5384; H01L 23/5385; H01L 23/5386; H01L 23/49811; H01L 23/49816; H01L 25/0657; H01L 25/0652; H01L 25/16; H01L 27/0688; G05F 1/575
See application file for complete search history.

(56) References Cited

U.S. PATENT DOCUMENTS

| 2014/0210077 | A1* | 7/2014 | Chi .................. H01L 25/18 257/737 |
| 2018/0082978 | A1 | 3/2018 | Yu et al. |
| 2018/0190635 | A1* | 7/2018 | Choi .................. H01L 25/0657 |
| 2020/0075553 | A1 | 3/2020 | DeLaCruz et al. |
| 2020/0402934 | A1 | 12/2020 | Kim et al. |

(Continued)

OTHER PUBLICATIONS

International Search Report and Written Opinion issued in Application No. PCT/US2022/052129, mailed Apr. 27, 2023, 14 pages,.

(Continued)

*Primary Examiner* — Dao H Nguyen (57) ABSTRACT

A semiconductor package includes a package substrate having a first surface and an opposing second surface, and further includes an integrated circuit (IC) die disposed at the second surface and having a third surface facing the second surface and an opposing fourth surface. The IC die has a first region comprising one or more metal layers and circuit components for one or more functions of the IC die and a second region offset from the first region in a direction parallel with the third and fourth surfaces. The semiconductor package further includes a voltage regulator disposed at the fourth surface in the second region and having an input configured to receive a supply voltage and an output configured to provide a regulated voltage, and also includes a conductive path coupling the output of the voltage regulator to a voltage input of circuitry of the IC die.

23 Claims, 6 Drawing Sheets

(56) References Cited

U.S. PATENT DOCUMENTS

| | | |
|---|---|---|
| 2021/0249952 A1 | 8/2021 | Roth et al. |
| 2023/0090121 A1* | 3/2023 | DeLaCruz .......... H01F 17/0013 |
| 2023/0097714 A1* | 3/2023 | Lambert ............ H01L 23/5385 |
| | | 257/776 |

OTHER PUBLICATIONS

Sun, Teng et al. "3D Packaging with Embedded High-Power-Density Passives for Integrated Voltage Regulators" IEEE 69th Electronic Components and Technology Conference (ECTC), 2019 IEEE 69th Electronic Components and Technology Conference (ECTC), 2019, pp. 1300-1305, doi: 10.1109/ECTC.2019.00201, 6 pages.

Burton, Edward et al. "FIVR—Fully Integrated Voltage Regulators on 4th Generation Intel Core SoCs," 2014 IEEE Applied Power Electronics Conference and Exposition—APEC 2014, 2014, pp. 432-439, doi: 10.1109/APEC.2014.6803344. 8 pages.

International Preliminary Report on Patentability issued in Application No. PCT/US/2022/052129, mailed Jul. 7, 2024, 9 pages.

* cited by examiner

3D SEMICONDUCTOR PACKAGE WITH DIE-MOUNTED VOLTAGE REGULATOR

BACKGROUND

Electronic systems employ voltage regulators to provide regulated supply voltages to various components of the system. Voltage regulators traditionally have been implemented as discrete components at the circuit board upon which one or more semiconductor packages and other components are mounted. However, board-level voltage regulators are subject to relatively extensive parasitic losses resulting from inductive and/or capacitive loads introduced by the relatively long routing paths from board to package, particularly for the high-power delivery requirements of high-performance systems.

In an attempt to resolve the parasitic loss issues caused by board-level voltage regulators, some systems instead employ package-level voltage regulation in which one or more voltage regulators are mounted to the package substrate of a semiconductor package. While reducing overall transmission path lengths and thus parasitic loss, such solutions still require delivery of power from the substrate-mounted voltage regulator across the package substrate to the one or more dies of the package, which continues to introduce impedance to the power distribution network while also consuming limited package routing resources. In view of these limitations, other systems employ fully integrated voltage regulators (FIVRs) in which the circuitry of a voltage regulator is implemented directly in the same silicon die as the rest of the system on a chip (SOC) or other circuitry of that die. While this effectively minimizes the power delivery network length and thus presents minimal inductance, the silicon die often is fabricated using an advanced fabrication process and thus the use of FIVRs either increases the relatively expensive active die area of the silicon die or otherwise competes with the circuitry of other circuit functions, leading to undesirable tradeoffs in area, power, performance, and cost.

SUMMARY OF EMBODIMENTS

In accordance with one aspect, a semiconductor package includes a package substrate having a first surface and an opposing second surface, a first integrated circuit (IC) die disposed at the second surface and having a third surface facing the second surface and an opposing fourth surface, the first IC die having a first region comprising one or more metal layers and circuit components for one or more functions of the first IC die and a second region offset from the first region in a direction parallel with the third and fourth surfaces, a voltage regulator disposed at the fourth surface in the second region and having an input configured to receive a supply voltage and a first output configured to provide a regulated voltage, and a first conductive path coupling the first output of the voltage regulator to a voltage input of circuitry of the first IC die.

In accordance with another aspect, a semiconductor package includes a package substrate having a first surface and an opposing second surface, a three-dimensional (3D) stack of integrated circuit (IC) dies mounted at the second surface, the 3D stack comprising multiple die layers of IC dies, a voltage regulator mounted to a first IC die of a first die layer of the 3D stack and adjacent to a second IC die of a second die layer of the 3D stack in a direction parallel to the second surface, a set of first conductive paths conductively coupling one or more outputs of the voltage regulator to circuitry of one or both of the first IC die or the second IC die, and a second conductive path conductively coupling an input of the voltage regulator to a package interconnect disposed at the first surface of the package substrate through at least the first IC die and the package substrate.

BRIEF DESCRIPTION OF THE DRAWINGS

The present disclosure is better understood, and its numerous features and advantages made apparent to those skilled in the art, by referencing the accompanying drawings. The use of the same reference symbols in different drawings indicates similar or identical items.

DETAILED DESCRIPTION

FIGS. 1-6 illustrate various example implementations of semiconductor packages employing one or more die-mounted voltage regulators to provide regulated voltages to one or more integrated circuit (IC) die of the semiconductor packages. In at least one embodiment, a semiconductor package includes a substrate and a stack of one or more IC die mounted thereon. The stack includes at least a first die layer having one or more IC die mounted proximate to the package substrate. In some embodiments, the stack is a three-dimensional (3D) stack and thus further includes at least a second die layer having one or more IC die mounted to at least one IC die of the first die layer. Additional die layers with IC die stacked on the IC die of the die layer "below" further may be implemented. The semiconductor package further includes one or more voltage regulators mounted on a corresponding "top" surface (that is, the surface opposite of the semiconductor package) of one or more IC die of the first die layer. Each such die-mounted voltage regulator is configured to receive a supply voltage via the package substrate and to provide one or more regulated voltages to one or more IC die of one or more die layers of the semiconductor package using one or more conductive paths composed of conductive structures of at least one or more of the package substrate, the IC die of the first layer, and/or or the IC die of at least the second layer. These conductive structures can include, for example, vias (including through silicon vias (TSVs) and through dielectric vias (TDVs)), metal traces at metal layers of the dies and/or substrate, package-to-die interconnects, die-to-die interconnects, substrate-to-die interconnects, interposer interconnects, and the like. Further, in some embodiments, a voltage regulator may span, or "straddle", multiple IC die of a die layer of the stack.

By implementing a discrete voltage regulator mounted to the surface of one or more IC die of the first, or base, die layer of the semiconductor package (or in some embodiments, a different die layer), this die-mounted voltage regulator can provide improved power distribution efficiency compared to package-substrate-level voltage regulators while avoiding the expense and complexity of implementing the VR circuitry within the IC die itself as found in FIVRs. Thus, a semiconductor package implementing one or more die-mounted voltage regulators as described herein can provide a balance of cost, complexity, and power delivery efficiency suitable for high-power/high-performance applications as well as other applications.

Note that in the following, certain positional terms, such as up, down, top, bottom, and the like, are used in a relative sense to describe the positional relationship of various components. These terms are used with reference to the relative position of components as shown in the corresponding figure and are not intended to be interpreted in an absolute sense with reference to a field of gravity. Thus, for example, a surface shown in the drawing and referred to as a top surface of a component would still be properly understood as being the top surface of the component, even if, in implementation, the component was placed in an inverted position with respect to the position shown in the corresponding figure and described in this disclosure.

Figure 1:
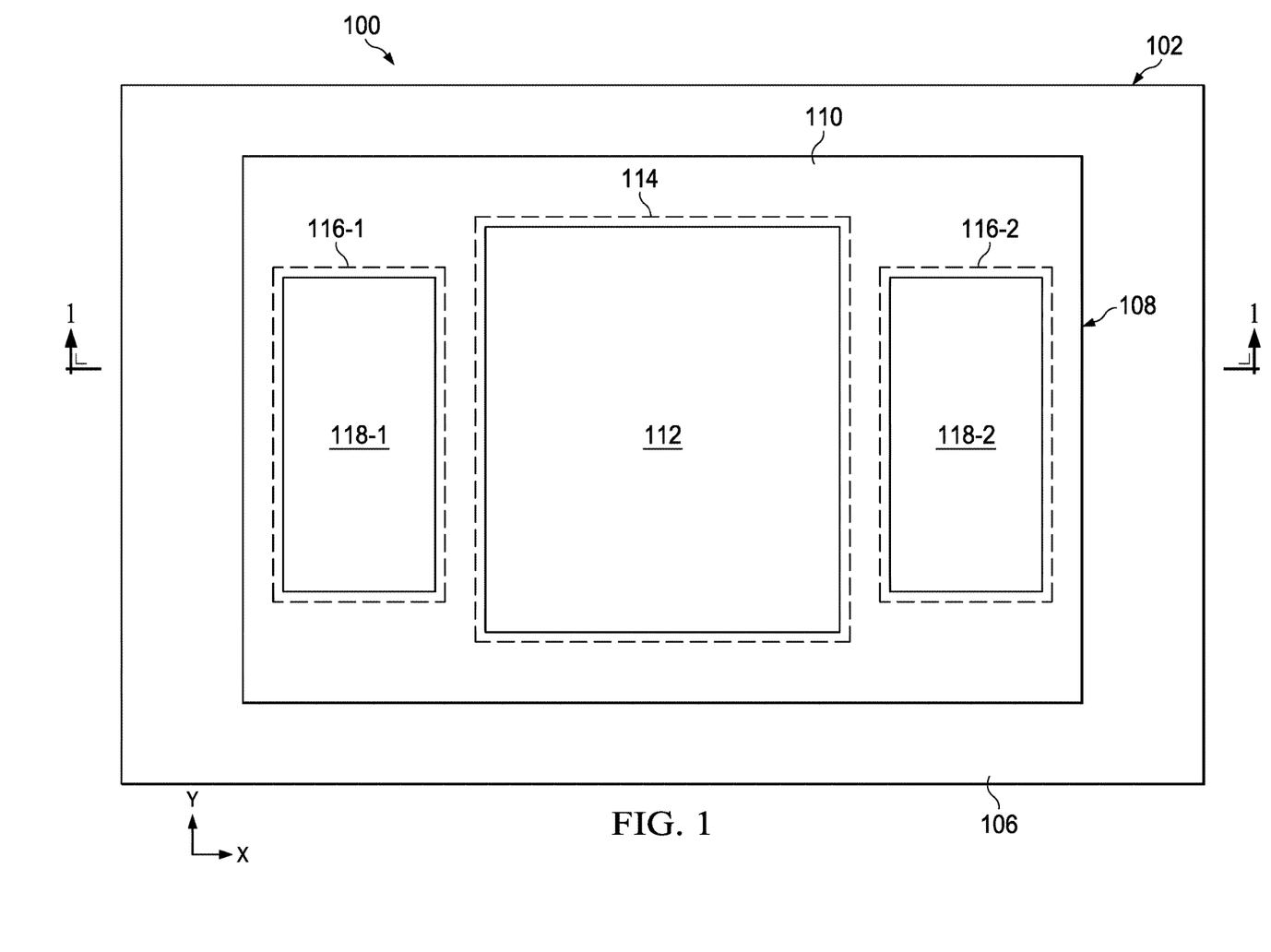
FIG. 1 is a top view of a semiconductor package having die-mounted voltage regulators in accordance with some embodiments.
Figure 2:
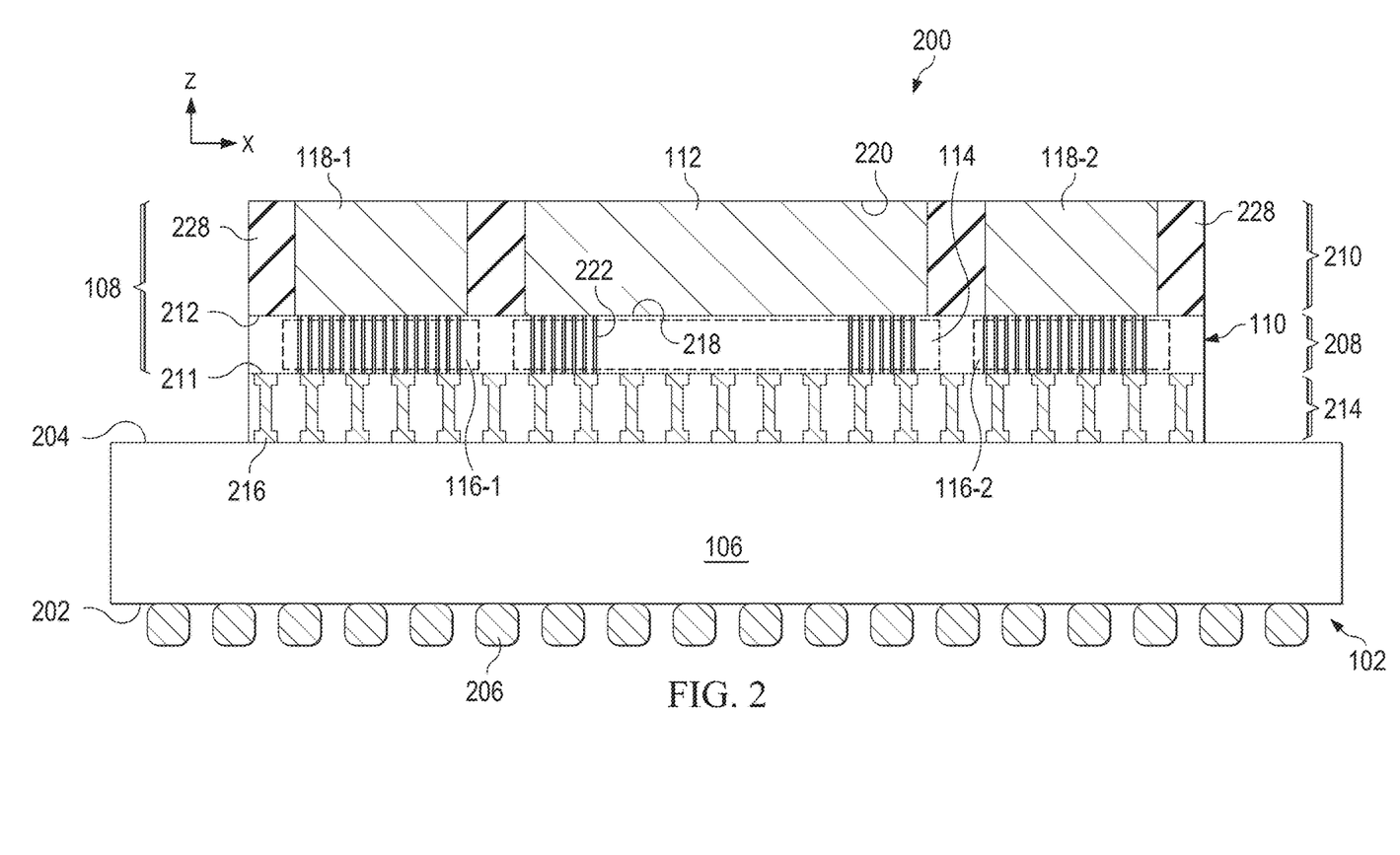
FIG. 2 is a cross-section view of the semiconductor package of FIG. 1 in accordance with some embodiments.

FIGS. 1 and 2 illustrate a top view 100 (FIG. 1) and side view (200) view 200 (FIG. 2) of a semiconductor package 102 employing one or more die-mounted voltage regulators in accordance with some embodiments. In the depicted example, the semiconductor package 102 includes a package substrate 106 and a stack 108 of one or more die layers mounted on the package substrate 106. The package substrate 106 (hereinafter, "substrate 106" for brevity) can comprise any of a variety of electrical interconnect substrates employed to provide mechanical support and an electrical interface between an underlying printed circuit board (PCB) or other carrier board and the stack 108, such as an epoxy-based laminate substrate (e.g., FR4), a Bismaleimide-Triazine (BT)-based laminate substrate, and the like. The substrate 106 includes a first major surface 202 and an opposing second major surface 204, along with one or more metal layers, vias, and other conductive structures to provide electrically conductive pathways between the surfaces 202 and 204 or between points on the same surface. An array of package interconnects 206 is disposed at the "bottom" surface 202 to provide electrical and mechanical connections between corresponding electrically conductive pathways of the substrate 106 and a PCB or other carrier structure (not shown) upon which the semiconductor package 102 is mounted. The array of package interconnects 206 can comprise solder-based interconnects, such as solder balls of a ball grid array (BGA), pin-based interconnects, such as the pins of a land grid array (LGA), flat interconnects such in a quad flat package (QFP) array, and the like.

The stack 108 comprises one or more die layers, with each die layer comprising one or more IC die arranged laterally at the corresponding layer. In the depicted example, the stack 108 is a 3D stack and includes a first, or base, die layer 208 and a second die layer 210, with the first die layer 208 comprising a single IC die 110 and the second die layer 210 comprising a single IC die 112. However, in other embodiments, the stack 108 includes a single die layer or includes more than two die layers. Likewise, in other embodiments, the first die layer 208 comprises multiple IC die and/or the second die layer 210 comprises multiple IC die. Each IC die (e.g., die 110, 112) implements one or more integrated circuit (IC) components of the semiconductor package 102, such as one or more central processing units (CPU), graphics processing units (GPUs), machine learning (ML) accelerators, or combinations thereof, as well as associated circuitry, such as memory controllers, input/output (I/O) controllers, data/controller interconnects, on-chip memory and caches, and the like. For the purposes of illustration, the die 110, 112 are described in an example context in which both of these dies are SOCs implementing various compute resources. For example, the die 112 can comprise an SOC implementing high-performance compute resources, such as one or more processors, cache, and the like, and thus requiring a more costly fabrication process, whereas other compute components that do not require similar performance characteristics, such as I/O controllers, memory controllers, and the like, are implemented at the die 110 using a less costly fabrication process.

As depicted, the die 110 is mounted to the second surface 204 of the substrate 106 and has a third major surface 211 facing the second surface 204 of the substrate 106 and an opposing fourth major surface 212. The die 110 is electrically connected to one or more corresponding pads or other electrical contacts of the substrate 106 via a corresponding array of interconnects, which can include, for example, a BGA, an LGA, a QFP array, C4 bumps, microbumps, copper pillars or other metal/metal alloy pillars, an interposer structure, and the like. Further, in instances in which additional mechanical bonding beyond that provided by the interconnects, the die 110 can be further mechanically bonded to the second surface 204 via an adhesive or other bonding agent. To illustrate, in the depicted example, the die 110 is electrically and mechanically connected to the substrate 106 using an array 214 of die-to-substrate interconnects 216 (e.g., copper pillar interconnects or microbumps). In other embodiments, the semiconductor package 102 could instead employ an interposer layer composed of a silicon or glass layer having an array of TSVs/TDVs or other conductive structures extending between the two opposing surfaces of the silicon/glass interposer layer. However, in other embodiments, other types of substrate-to-die connections can be employed.

The die 112 of the second layer 210, in turn, is mounted to the fourth surface 212 of the die 110 and has a fifth major surface 218 facing the fourth surface 212 and an opposing sixth major surface 220. The die 112 may be mounted "face up" with the active surface of the die 112 facing away from the die 110 and thus necessitating TSVs in the die 112 to establish electrical connections with the die 110, or the die 112 may be mounted "face down" (as shown in FIG. 2) with the active surface of the die 112 facing the die 110 and thus avoiding the need for TSVs or similar through-die connections in the die 112 for purposes of establishing electrical connections with the die 110. Electrical connections between the die 110 and the die 112 thus may formed using any of a variety of suitable die-to-die interconnects, such as microbumps or hybrid bonding. Power delivery to the die 112 between the die 110, 112 (and signaling in the case of "back-to-face" mounting of the die 112 relative to the die 110) is achieved through the use of TSVs in the die 110, such as TSVs 222, which in turn can connect to one or more metal layers or surface interconnects of the die 110, 112, as well as to the die-to-substrate interconnects 216 between the die 110 and the substrate 106.

The circuitry of the dies of the stack 108 requires well-regulated input voltages to operate reliably. Accordingly, to provide some or all of these regulated voltages, the semiconductor package 102 further includes at least one voltage regulator (VR) 118 mounted on one or more die of the first die layer 208. For example, in the illustrated example, the semiconductor package 102 includes two VRs, VR 118-1 and VR 118-2, mounted at the "top" surface 212 the die 110 of the first die layer 208 on either side of the die 112 of the second die layer 210 that is mounted on the surface 212 of the die 110 as well.

The VR 118 typically is implemented as a DC-DC power converter, such as a buck converter, a boost converter, a buck-boost, converter, a Ĉuk converter, and the like. Thus, the VR 118 receives a higher supply voltage (e.g., 20 VDC) and downconverts the higher supply to one or more regulated voltages (e.g., 1.1 VDC). Typically, such VRs are implemented as a switching network composed of diodes and/or transistors (e.g., metal-oxide-silicon field effect transistors (MOSFETs), insulated-gate bipolar transistors (IGBTs), or bipolar junction transistors (BJTs)), one or more energy storage components, such as capacitors and/or inductors, and one or more filter circuits, which typically include some arrangement of capacitors, inductors, and/or resistors, as well as the wiring, metal traces, or other conductive interconnects used to interconnect these other components into a corresponding VR circuit. Accordingly, these die-mounted VRs 118 can be implemented as a collection of discrete circuit components individually mounted at the surface 212 of the die 110, as an IC package or other package mounted at the surface 212 of the die 110, or a combination of discrete circuit components and package(s) mounted at the surface 212. For example, the transistors and other logic of the circuitry comprising a VR 118 can be implemented as one or more surface-mount packages while certain passive circuitry, such as inductors, resistors, and/or capacitors and their corresponding conductive interconnects, can be mounted as separate discrete circuit components, or the entire circuitry may be implemented on a die or substrate which can then be packaged and mounted on the die 110, or mounted without packaging on the die 110.

The VRs 118-1 and 118-2 are configured to receive one or more supply voltages via the substrate 106 (received either via one of the interconnects 216 or via a power interface disposed at surface 204 of the substrate 106) and to regulate the received supply voltage(s) to provide one or more output regulated voltages for distribution to the die(s) of one or more die layers of the 3D stack 108 (e.g., die 110 of die layer 208 and die 112 of die layer 210). These one or more regulated voltages are supplied from each VR 118 via a corresponding power distribution network (not shown in FIG. 1) composed of one or more conductive paths between a voltage output of the corresponding VR 118 and a corresponding voltage input of an IC of the receiving die of the stack 108. These conductive paths are composed of various conductive structures of the die of the 3D stack 108, the substrate 106, and/or the interconnect array 214. These conductive structures can include metal lines (or traces) of metal layers of the die of the 3D stack, metal lines of metal layers of the substrate 106, intra-die vias, TSVs, such as TSVs 222, through-dielectric vias (TDVs), die-to-die interconnects, die-to-substrate interconnects (e.g., interconnects 216), and the like. Example conductive paths for supply voltage distribution and regulated voltage distribution in the semiconductor package 102 are described in greater detail below with reference to FIGS. 3 and 4.

As the VRs 118-1 and 118-2 are mounted at the top surface 212 of the "bottom" die 110, the semiconductor package 102, in one embodiment, utilizes TSVs, die-to-die interconnects, and substrate-to-die interconnects to distribute supply voltage(s) from the substrate 106 to the VRs 118-1 and 118-2, and to distribute regulated voltage(s) from the VRs 118-1 and 118-2 to the die 110 and 112. The semiconductor package 102 further may employ various protective or structural features to complete packaging of the device, such as the use of packaging dielectric encapsulation layer 228 that encapsulates the die 112 and the VRs 118-1 and 118-2, a package lid (not shown), and the like.

For purposes of reference, in FIGS. 1 and 2 the approximate region of the die 110 that overlaps with the die 112 is identified as "region 114" while the approximate regions of the die 110 that overlap with the VRs 118-1 and 118-2 are identified as "region 116-1" and "region 116-2", respectively. Note that the size of these regions are exaggerated relative to the actual overlapped regions of the die 110 for ease of identification and illustration. Moreover, while regions 116-1 and 116-2 are illustrated and described as laterally offset from region 114, in some embodiments this offset is complete in that region 114 does not overlap with either region 116-1 or region 116-2, while in other embodiments this offset is only partial in that region 114 partially or completely overlaps with one or both of region 116-1 or region 116-2.

Figure 3:
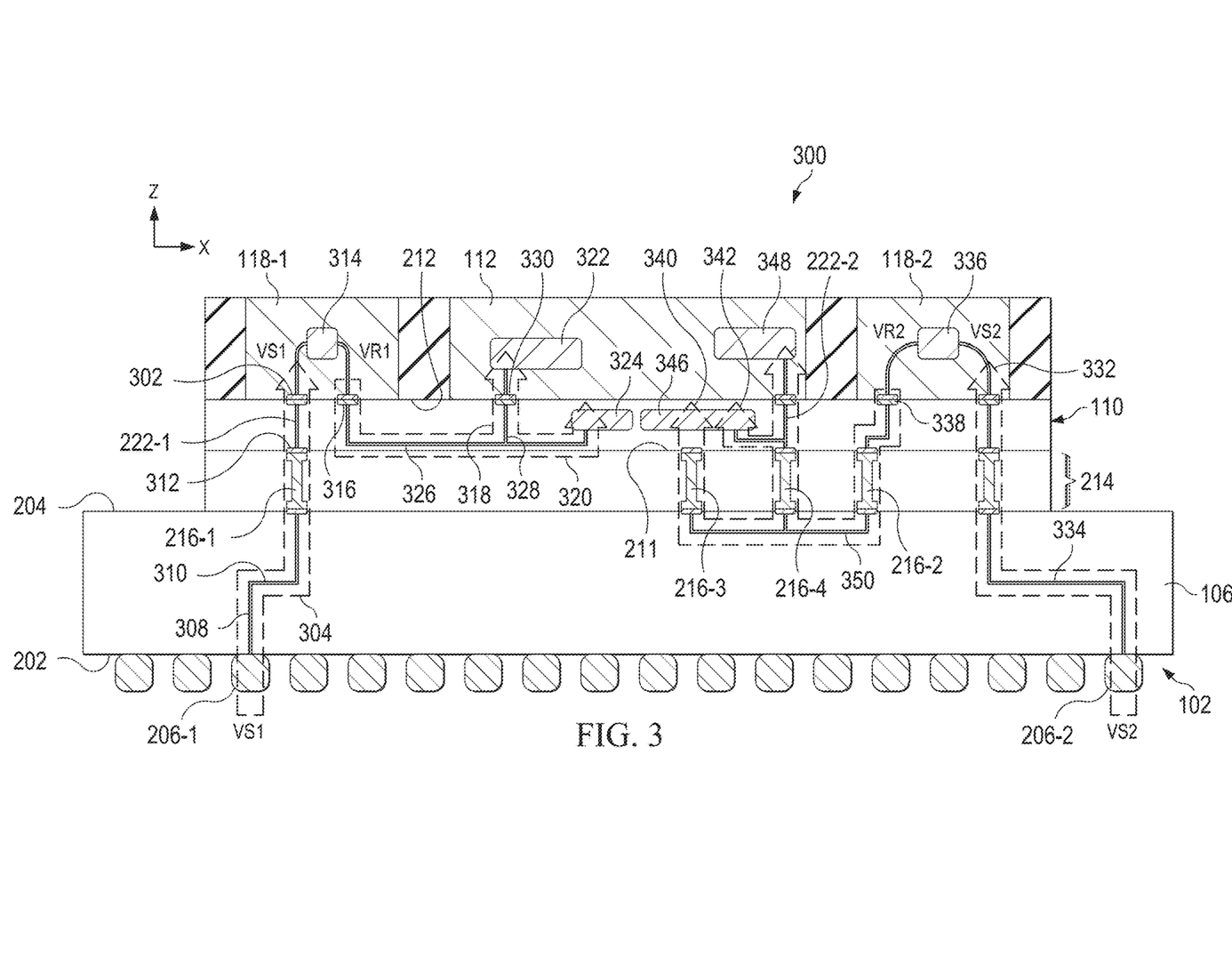
FIG. 3 is a cross-section view of the semiconductor package of FIG. 1 illustrating various voltage routing paths for supply voltage routing and regulated voltage routing between the voltage regulator and the die of the semiconductor package in accordance with some embodiments.
Figure 4:
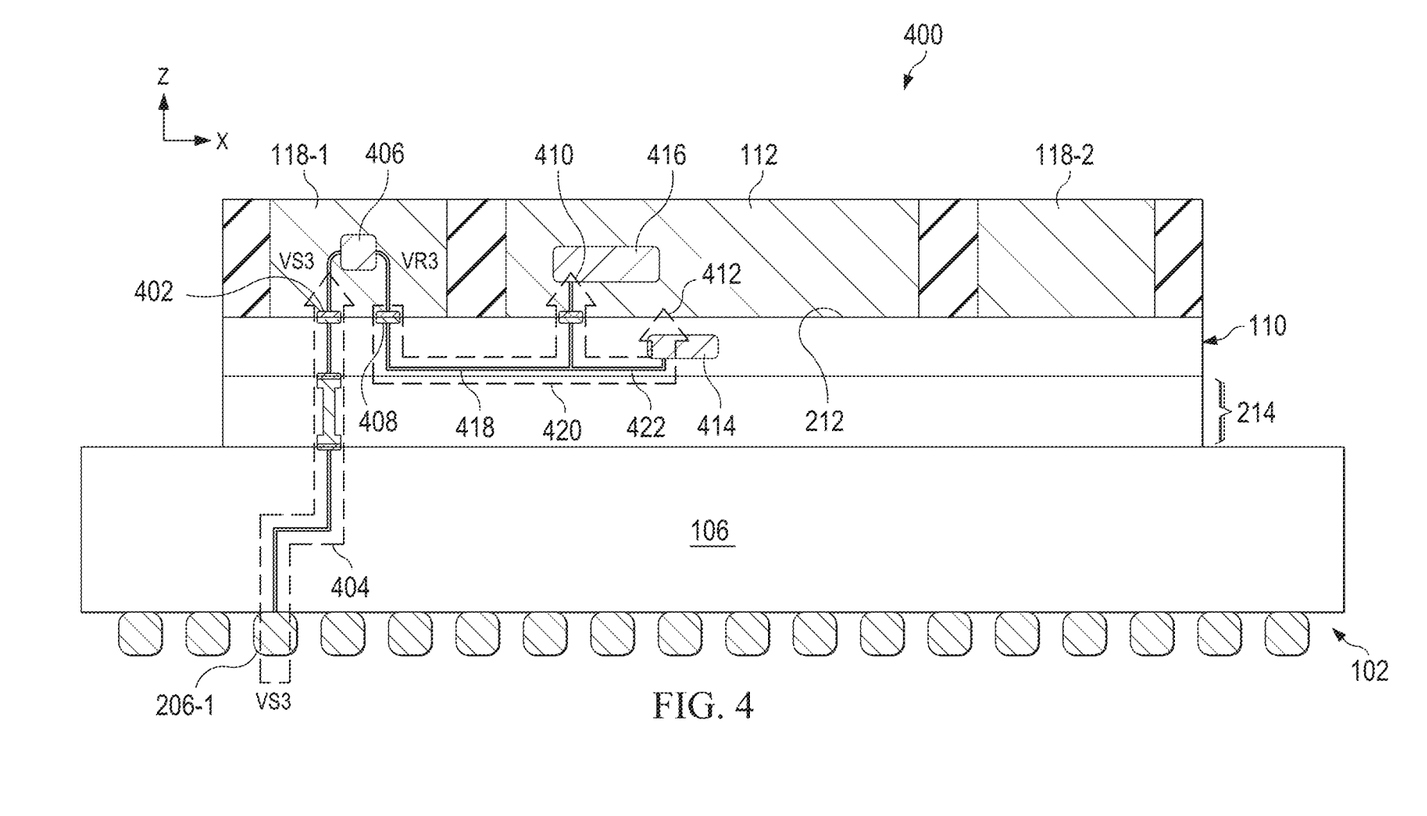
FIG. 4 is a cross-section view of the semiconductor package of FIG. 1 illustrating additional voltage routing paths for supply voltage and regulated voltage routing between the voltage regulator and the die of the semiconductor package in accordance with some embodiments.

Referring now to FIGS. 3 and 4, example routes for conductive paths within the semiconductor package 102 for distributing supply voltage to the VRs 118-1 and 118-2 or distributing regulated voltages from the VRs 118-1 and 118-2 to the die of the 3D stack 108 are illustrated. In particular, FIG. 3 illustrates a simplified cross-section view 300 of an example implementation of the semiconductor package 102 along line 1-1 depicting conductive paths for regulated voltage distribution that utilizes front-side metal of the die 110 of the base die layer 208 for regulated voltage distribution for the die 110 and 112. In the depicted example, a supply voltage VS1 is provided as an input voltage for the VR 118-1 and a supply voltage VS2 is provided as an input voltage for the VR 118-2, where VS1 and VS2 can be the same or different supply voltages. Typically, VS1 and VS2 are supplied via one or more board-level power supplies that receive power from one or more external power supplies, such as a rack-mounted power supply in a server implementation. In this example, the supply voltages VS1 and VS2 are input from the PCB or other carrier (not shown) upon which the semiconductor package 102 is mounted via package-to-board interconnects 206-1 and 206-2 (e.g., BGA solder balls, LGA pins, etc.), respectively.

The supply voltage VS1 is then provided to the VR 118-1 via one or more conductive paths through the semiconductor package 102. Typically, multiple routes are employed, but for ease of illustration a single conductive path 304 is depicted and described. The other conductive paths may be similarly configured. In this example, the supply voltage VS1 is directed from the interconnect 206-1 to an input 302 of the VR 118-1 via the conductive path 304 routed through the substrate 106, the interconnect array 214, and the die 110. Thus, the portion of the conductive path 304 traversing the substrate 106 can include the interconnect 206-1 at the surface 202 of the substrate 106 and a die-to-substrate interconnect 216-1 between the substrate 106 and the die 110, and one or more vias (e.g., via 308) and metal line segments (e.g., metal line segment 310) that form a conductive route between the interconnect 206-1 and the interconnect 216-1. The portion of the conductive path 304 traversing the die 110 thus can include, for example, a TSV 222-1 extending between the surfaces 211 and 212 of the die 110 and electrically connecting the interconnect 312 to the input 302 of the VR 118-1. DC-DC converter circuitry 314 of the VR 118-1 then converts the supply voltage VS1 to at least a regulated voltage VR1, which is supplied to one or more outputs proximate to the surface 212 of the die 110. For ease of illustration, a single output 316 of the VR 118-1 proximate to the surface 212 of the die 110 and its corresponding paths for routing the voltage VR1 within the semiconductor package 102 are described. Conductive paths 318, 320 of the semiconductor package 102 then distribute this regulated voltage VR1 from output 316 to IC circuitry 322 and 324 of the die 110 and 112, respectively. As illustrated, the conductive paths 318, 320 utilize front-side metal layer(s) of the die 110 proximate to the surface 212 to route the regulated voltage VR1 laterally through the die 110. For example, both paths 318, 320 may employ a via to connect the output 316 to a metal trace segment 326 at a frontside metal layer proximate to surface 212. The metal trace segment 326 then extends laterally into the region 114 (FIGS. 1 and 2) of the die 110, and electrically couples with the IC circuitry 324 via one or more vias or other conductive structures within the die 110. The conductive path 320, in turn, can branch from the metal line segment 326 using a TSV 328 or other similar structure to provide a conductive path from the metal line segment 326 to a die-to-die interconnect (e.g., aligned microbumps) 330 that in turn is electrically coupled to an input of the IC circuitry 322 via one or more vias, metal traces, or other conductive structures of the die 112.

Turning to the VR 118-2, the supply voltage VS2 is directed from the interconnect 206-2 to an input 332 of the VR 118-1 via a conductive path 334 routed through the substrate 106 and the die 110 in a manner similar to that of conductive path 304. From there, DC-DC converter circuitry 336 of the VR 118-2 converts the supply voltage VS2 to at least a regulated voltage VR2, which is supplied to an output 338 of the VR 118-2 proximate to the surface 212 of the die 110. Conductive paths 340, 342, and 344 of the semiconductor package 102 then distribute this regulated voltage VR2 to IC circuitry 346 and 348 of the die 110 and 112, respectively. In this particular example, the conductive paths 340, 342, and 344 employ a "package-substrate-assist" approach in which the regulated voltage VR2 is routed "down" through the die 110 to the substrate 106, which is then used to route the regulated voltage VR2 laterally toward the regions of the IC circuitry 346 and 348, whereupon the regulated voltage VR2 is then routed back "up" through the die 110. For example, each paths 340-344 may employ one or more vias and/or metal traces at one or more metal layers (depending on the end metal layer) of the die 110 to connect the output 338 to an interconnect 216-2 that extends from the surface 212 of the die 110 to the surface 204 of the substrate 106. One or more vias, metal segments of one or more metal layers of the substrate 106 that are proximate to the surface 204 (e.g., metal segment 350) then are used to route the regulated voltage VR2 laterally across the substrate 106 to points underlying the IC circuitry 346 and 348. From there, the conductive path 340 employs an interconnect 216-3 of the array 214 and one or more conductive structures of the die 110 to route the regulated voltage VR2 from the surface 204 of the substrate 106 to a voltage input of the IC circuitry 346. Similarly, the conductive path 342 employs an interconnect 216-4 of the array 214 and one or more conductive structures of the die 110 to route the regulated voltage VR2 from the surface 204 of the substrate 106 to another voltage input of the IC circuitry 346. Still further, the conductive path 344 employs the interconnect 216-4 of the array 214, a TSV 222-2 of the die 110 (and one or more other conductive structures of the die 110), and one or more conductive structures of the die 110 to route the regulated voltage VR2 from the surface 204 of the substrate 106 to a voltage input of the IC circuitry 348 of the die 112.

FIG. 4 illustrates a simplified cross-section view 400 of a different example implementation of the semiconductor package 102 along line 1-1 depicting conductive paths for regulated voltage distribution that utilizes back-side metal of the die 110 of the base die layer 208 for regulated voltage distribution for the die 110 and 112. In this example, the supply of voltage to, and the supply of voltage from, only the VR 118-1 is discussed, with the distribution of supply voltage(s) to, and the distribution of regulated voltage(s) from, the VR 118-2 utilizing similar approaches as those described for the VR 118-1 but omitted from FIG. 4 for ease of illustration. In the depicted example, a supply voltage VS3 is provided as an input voltage for the VR 118-1 from an external power supply via the PCB or other carrier (not shown) upon which the semiconductor package 102 is mounted via package-to-board interconnect 206-1.

The supply voltage VS3 is directed from the interconnect 206-1 to an input 402 of the VR 118-1 via a conductive path 404 routed through the substrate 106 and the die 110 via various conductive structures of, and between, the substrate 106 and the die 110, as similarly described above with reference to the conductive path 304 of FIG. 3. DC-DC converter circuitry 406 of the VR 118-1 then converts the supply voltage VS3 to at least a regulated voltage VR3, which is supplied to an output 408 of the VR 118-1 proximate to the surface 212 of the die 110. Conductive paths 410, 412 of the semiconductor package 102 then distribute this regulated voltage VR3 to IC circuitry 414 and 416 of the die 110 and 112, respectively. As illustrated, the conductive paths 410, 412 utilize back-side metal layer(s) of the die 110 proximate to the surface 212 to route the regulated voltage VR3 laterally through the die 110 from the region 116-1 (FIG. 1) underlying the VR 118-1 to the region 114 (FIG. 1) of the die 110. For example, both paths 410, 412 may employ a via to connect the output 408 to a metal trace segment 418 at a backside metal layer proximate to surface 212. The metal trace segment 418 then extends laterally toward the region 114 of the die 110. The conductive path 410 then may further include one or more vias and one or more metal traces at one or more metal layers of the die 110, such as TSV 420 and metal trace 422, to transition from the backside layers to the frontside layers of the die 110 and electrically connect a voltage input of the IC circuitry 414 to the metal trace segment 418, and thus provide routing for the regulated voltage VR3 to the IC circuitry 414. Similarly, the conductive path 412 can employ one or more vias, one or more metal traces of one or more metal layers of the die 110 and the die 112, and one or more die-to-die interconnects or other conductive structures to transition from the die 110 to the die 112 and to electrically connect the metal trace segment 418 to a voltage input of the IC circuitry 416 of the die 112 and thus provide routing for the regulated voltage VR3 from the VR 118-1 to the IC circuitry 416.

While FIGS. 3 and 4 illustrate examples of conductive paths for routing supply voltages to die-mounted VRs and for routing regulated voltages from the die-mounted VRs to IC circuitry in the dies of the 3D stack 108, the present disclosure is not limited to these specific examples. For example, in some implementations, a frontside-metal-based approach can be utilized for distributing some regulated voltages from a VR 118, while a backside-metal-based approach can be used for distributing other regulated voltages from the same or different VR 118, or different approaches can be utilized for the same regulated voltage for different destinations within the 3D stack 108.

Although FIGS. 1-4 illustrate example implementations in which each die-mounted VR is mounted on a single die (and the same die) of the 3D stack 108, the present disclosure is not limited to this particular arrangement. In other embodiments, different VRs may be mounted on different die of the same die layer. Further, in some embodiments, different VRs may be mounted on different die of different layers. For example, in some embodiments, a die-mounted VR may be mounted to a die of the second die layer 210. Still further, in some embodiments, a die-mounted VR may be mounted on multiple die of the same die layer; that is, a die-mounted VR may span multiple die of the corresponding die layer of the 3D stack.

Figure 5:
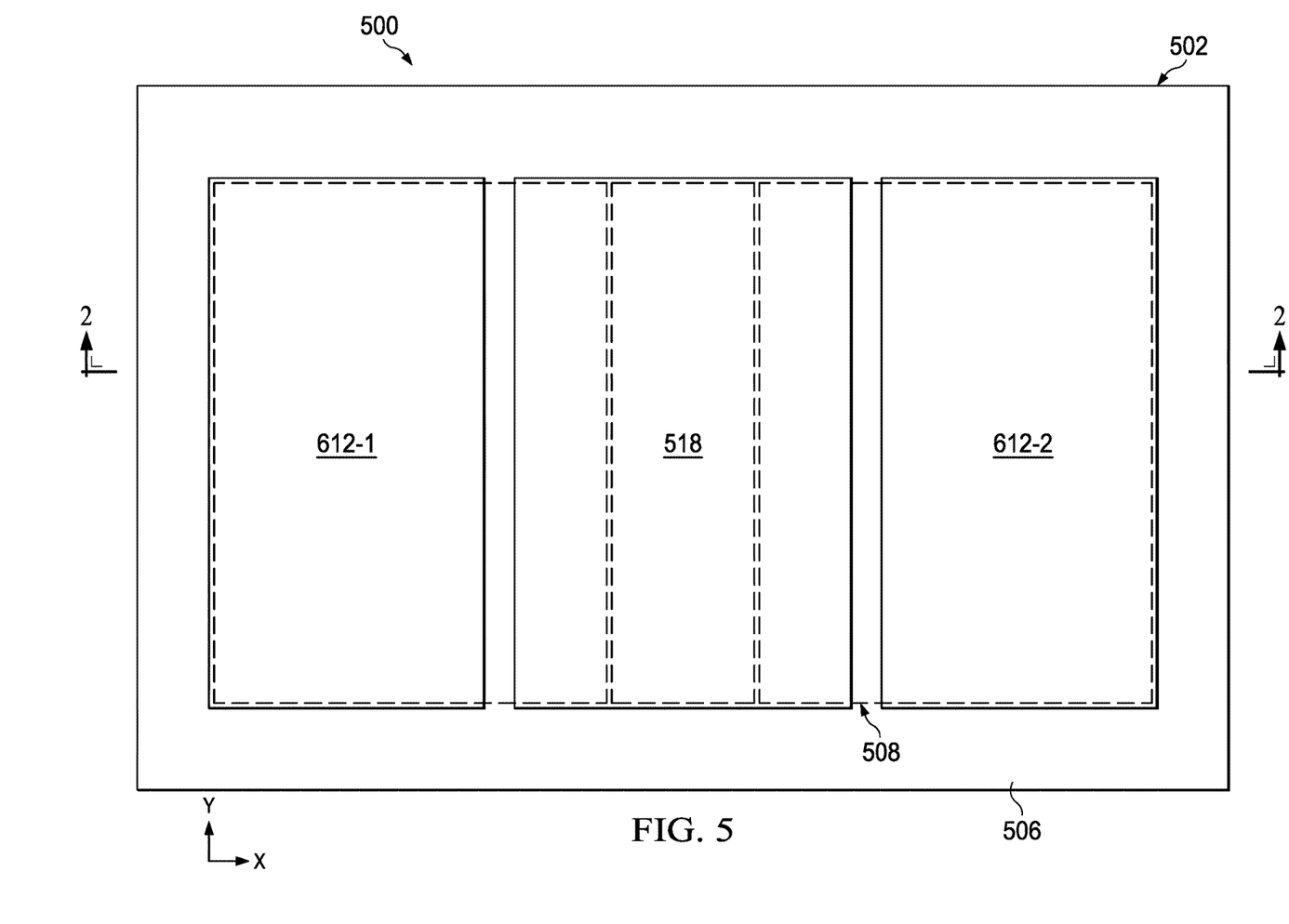
FIG. 5 is a top view of a semiconductor package having a die-mounted voltage regulator spanning multiple integrated circuit (IC) die of the semiconductor package in accordance with some embodiments.
Figure 6:
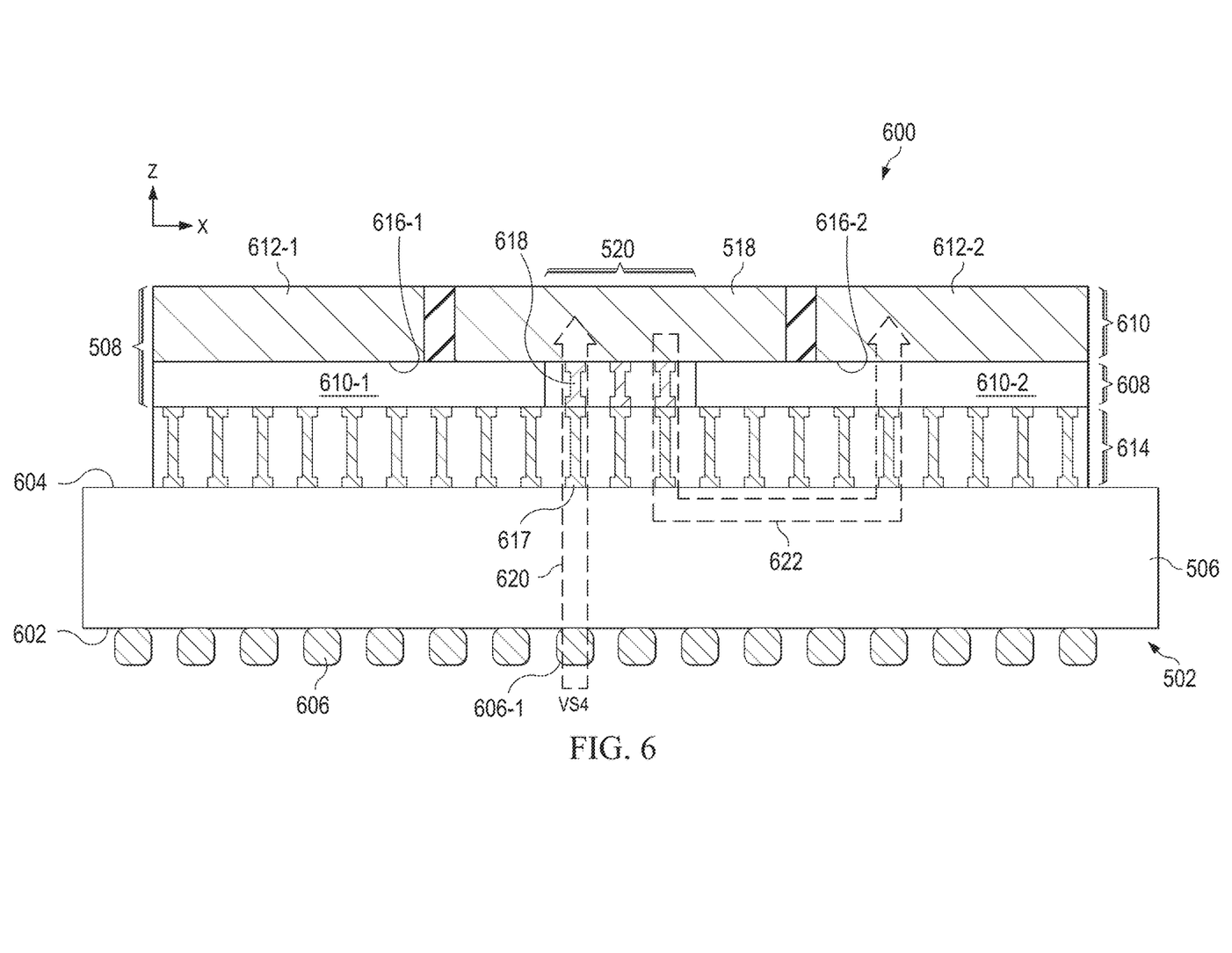
FIG. 6 is a cross-section view of the semiconductor package of FIG. 5 in accordance with some embodiments.

FIGS. 5 and 6 together illustrate a top view 500 and cross-section view 600, respectively, of a semiconductor package 502 implementing such a multiple-die-spanning VR in accordance with some embodiments. In the depicted example, the semiconductor package 502 includes a package substrate 506 and a 3D stack 508 of one or more die layers mounted on the package substrate 506 (hereinafter, simply "substrate 506"). The substrate 506 includes a first major surface 602 and an opposing second major surface 604. An array of package interconnects 606 is disposed at the "bottom" surface 602 to provide electrical and mechanical connections between corresponding electrically conductive pathways of the substrate 506 and a PCB or other carrier structure (not shown) upon which the semiconductor package 502 is mounted.

The 3D stack 508 comprises one or more die layers, with each die layer comprising one or more IC die arranged laterally at the corresponding layer. In the depicted example, the stack 508 includes a first, or base, die layer 608 and a second die layer 610, with the first die layer 608 comprising two IC die 610-1 and 610-2 mounted at the top surface 604 of the substrate 506 via an array 614 of substrate-to-die interconnects (e.g., copper pillars) and the second die layer 610 comprising two IC die 612-1 and 612-2, with the die 612-1 mounted at a top surface 616-1 of the die 610-1 and the die 612-2 mounted at a top surface 616-2 of the die 610-2. The die 612-1 and 612-2 may be mounted face-down or face-up, or with one face-down and the other face-up.

The semiconductor package 502 further includes a die-mounted VR 518. However, rather than being mounted at a single die as with the VR 118 of FIGS. 1-4, in the depicted embodiment the VR 518 spans multiple die of the stack 508, namely die 610-1 and 610-2. Thus, as shown, the VR 518 overlaps with an edge of die 610-1 and with an opposing edge of die 610-2. As similarly explained above, the regions of the die 610-1 and 610-2 that overlap with the VR 118 can be used for the formation of conductive structures to bring supply voltage(s) to the VR 118 and to distribute regulated voltage(s) from the VR 518 to the die of the stack 508 in a manner that reduces the floorplan consumption and parasitic influence of such structures on the IC circuitry in the active regions of the die of the stack 508.

It should be appreciated that this configuration is but a single example of the possible configurations for the 3D stack 508. For example, the 3D stack 508 could include four bottom die 610 arranged in a 2×2 array with the VR 518 in the middle of the 2×2 array such that the VR 518 overlaps with the corners of all four bottom die 610. Moreover, although only a single overlapping VR 518 is shown, in other configurations the package 502 can include multiple overlapping VRs using the techniques described herein.

In the depicted configuration, one or more supply voltages can be routed to the VR 518 via the substrate 506 and DC-DC converter circuitry (not shown) of the VR 518 can convert the one or more supply voltages into one or more regulated voltages that can be routed to IC circuitry of the die 610-1, 610-2, 612-1, and 612-2 using conductive path structures that span the dies and/or the substrate 506 as similarly described above. Moreover, when there is an offset region laterally separating the die upon which the VR is mounted, such as the offset region 520 between die 610-1 and 610-2 and spanned by the VR 518, this offset region can be utilized to route supply voltage(s) to the VR without requiring TSVs or other die-spanning conductive structures in the underlying die. Similarly, this offset region can be utilized to implement "package-substrate-assist" regulated voltage routing via the substrate 506 in a manner that does not require TSVs through the underlying die in order for the corresponding regulated voltage to reach the substrate 506 from the VR 518. To illustrate, to route a supply voltage VS4 to the VR 518 via interconnect 606-1, a corresponding conductive path 620 can employ a series of one or more conductive structures that span from the top surface 604 of the substrate 506 to the bottom surface of the VR 518 through the offset region 520, such as an interconnect 618 and a TDV 617. Similarly, a conductive path (e.g., conductive path 622) for routing a regulated voltage from the VR 518 to one or more dies of the stack 508 via the substrate 506 (that is, a "package-substrate-assist" route) can use a similar series of one or more TDVs to span the dielectric material between the bottom surface of the VR 518 and the top surface 604 of the substrate in the volume aligned with the offset region 520. Alternatively, in other embodiments, a silicon die, chip, or other silicon-based layer can be disposed in place of the dielectric layer in the offset region 520, and this silicon layer can include one or more TSVs that span between the bottom surface of the VR 518 and the top surface 604 of the substrate, with one or more of these TSVs serving as a conductive structure in the conductive path 622.

In some embodiments, the apparatus and techniques described above are implemented in a system including one or more integrated circuit (IC) devices (also referred to as integrated circuit packages or microchips), such as the semiconductor packages described above with reference to FIGS. 1-6. Electronic design automation (EDA) and computer-aided design (CAD) software tools may be used in the design and fabrication of these IC devices. These design tools typically are represented as one or more software programs. The one or more software programs include code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer-readable storage medium accessible to the computing system. Likewise, the code representative of one or more phases of the design or fabrication of an IC device may be stored in and accessed from the same computer-readable storage medium or a different computer-readable storage medium.

A computer-readable storage medium may include any non-transitory storage medium, or combination of non-transitory storage media, accessible by a computer system during use to provide instructions and/or data to the computer system. Such storage media can include, but is not limited to, optical media (e.g., compact disc (CD), digital versatile disc (DVD), Blu-ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer-readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory) or coupled to the computer system via a wired or wireless network (e.g., network accessible storage (NAS)).

In some embodiments, certain aspects of the techniques described above may be implemented by one or more processors of a processing system executing software. The software includes one or more sets of executable instructions stored or otherwise tangibly embodied on a non-transitory computer-readable storage medium. The software can include the instructions and certain data that, when executed by the one or more processors, manipulate the one or more processors to perform one or more aspects of the techniques described above. The non-transitory computer-readable storage medium can include, for example, a magnetic or optical disk storage device, solid-state storage devices such as Flash memory, a cache, random access memory (RAM) or other non-volatile memory device or devices, and the like. The executable instructions stored on the non-transitory computer-readable storage medium may be in source code, assembly language code, object code, or other instruction format that is interpreted or otherwise executable by one or more processors.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A semiconductor package comprising:
    a package substrate having a first surface and an opposing second surface;
    a first integrated circuit (IC) die disposed at the second surface and having a third surface facing the second surface and an opposing fourth surface, the first IC die having a first region comprising one or more metal layers and circuit components for one or more functions of the first IC die and a second region offset from the first region in a direction parallel with the third and fourth surfaces;
    a voltage regulator disposed at the fourth surface in the second region and having an input configured to receive a supply voltage and a first output configured to provide a regulated voltage;
    a first conductive path coupling the first output of the voltage regulator to a voltage input of an IC of the first IC die; and
    a second conductive path coupling the supply voltage to the input of voltage regulator, the second conductive path comprising a through silicon via (TSV) that traverses the first IC die by extending through the first IC die between the third and fourth surfaces of the first IC die.

2. The semiconductor package of claim 1, wherein the first conductive path includes:
    a via extending from the third surface to a metal layer of the first IC die proximate to the third surface in the second region; and
    a metal trace of the metal layer of the first IC die, the metal trace coupled to the via and extending from the via to the first region.

3. The semiconductor package of claim 1, wherein the first conductive path includes:
    a metal trace of a first metal layer of the first IC die proximate to the fourth surface and extending from the second region to the first region;
    a second metal layer of the first IC die proximate to the third surface; and
    a via disposed in the first region, the via coupled to the metal trace and extending between the first metal layer and the second metal layer.

4. The semiconductor package of claim 1, wherein the first conductive path includes:
    a via disposed in the second region, the via extending between a first metal layer of the first IC die proximate to the fourth surface to a second metal layer of the first IC die proximate to the third surface;
    first and second interconnects of the first IC die disposed at the third surface and conductively coupled to a third metal layer of the package substrate, the first interconnect underlying the second region and the second interconnect underlying the first region and coupled to the voltage input; and
    a first metal trace of the third metal layer extending between the first and second interconnects.

5. The semiconductor package of claim 1, wherein the TSV is disposed in the second region and conductively couples to the input of the voltage regulator.

6. The semiconductor package of claim 1, wherein the semiconductor package is a stacked die package that further comprises:
    a second IC die having a fifth surface facing the fourth surface of the first IC die and an opposing sixth surface, the second IC die having a third region comprising metal layers and circuit components for one or more functions of the first IC die; and a third conductive path coupling a second output of the voltage regulator to a voltage input of the second IC die in the third region.

7. The semiconductor package of claim 6, wherein the voltage input of the IC of the first IC die and the voltage input of the second IC die are the same input.

8. The semiconductor package of claim 6, wherein the third conductive path includes:
a metal trace of a metal layer of the first IC die proximate to the third surface and extending from the second region to the first region.

9. The semiconductor package of claim 6, wherein the third conductive path includes:
a metal trace of a first metal layer of the first IC die proximate to the fourth surface and extending from the second region to the first region.

10. The semiconductor package of claim 6, wherein the third conductive path includes:
a via disposed in the second region, the via extending between a first metal layer of the first IC die proximate to the fourth surface to a second metal layer of the first IC die proximate to the third surface;
first and second interconnects of the first IC die disposed at the third surface and conductively coupled to a third metal layer of the package substrate, the first interconnect underlying the second region and the second interconnect underlying the first region and coupled to the voltage input of circuitry of the second IC die; and
a first metal trace of the third metal layer extending between the first and second interconnects.

11. A stacked die semiconductor package comprising:
a package substrate having a first surface and an opposing second surface;
a first integrated circuit (IC) die disposed at the second surface and having a third surface facing the second surface and an opposing fourth surface, the first IC die having a first region comprising one or more metal layers and circuit components for one or more functions of the first IC die and a second region offset from the first region in a direction parallel with the third and fourth surfaces;
a voltage regulator disposed at the fourth surface in the second region and having an input configured to receive a supply voltage and a first output configured to provide a regulated voltage;
a first conductive path coupling the first output of the voltage regulator to a voltage input of a first IC of the first IC die;
a second IC die having a fifth surface facing the fourth surface of the first IC die and an opposing sixth surface, the second IC die having a third region comprising metal layers and circuit components for one or more functions of the first IC die; and
a second conductive path coupling a second output of the voltage regulator to a voltage input of the second IC die in the third region; and
a third IC die disposed at the second surface, the third IC die having a fifth region comprising one or more metal layers and circuit components for one or more functions of the third IC die and a fourth region offset from the fifth region in a direction parallel with the second surface,
wherein the voltage regulator is further disposed at a surface of the third IC die opposite the second surface in the fourth region,
wherein the semiconductor package includes at least one of:
a third conductive path conductively coupling a third output of the voltage regulator to a voltage input of an IC of the second IC die, or
a fourth conductive path conductively coupling a fourth output of the voltage regulator to a voltage input of a second IC of the first IC die.

12. The semiconductor package of claim 11, wherein at least two of the first output, the second output, and the third output are the same output of the voltage regulator.

13. The semiconductor package of claim 11, wherein:
the input of the voltage regulator is aligned with an offset region separating the first IC die and the third IC die at the second surface of the package substrate; and
a conductive path conductively couples a package interconnect at the first surface of the package substrate with the input of the voltage regulator, the conductive path comprising at least one of:
a through dielectric via (TDV) in a dielectric layer disposed between the voltage regulator and the second surface in the offset region, or
a through silicon via (TSV) in a silicon layer disposed between the voltage regulator and the second surface in the offset region.

14. A semiconductor package comprising:
a package substrate having a first surface and an opposing second surface;
a first integrated circuit (IC) die disposed at the second surface and having a third surface facing the second surface and an opposing fourth surface, the first IC die having a first region comprising one or more metal layers and circuit components for one or more functions of the first IC die and a second region offset from the first region in a direction parallel with the third and fourth surfaces;
a voltage regulator disposed at the fourth surface in the second region and having an input configured to receive a supply voltage and a first output configured to provide a regulated voltage;
a first conductive path coupling the first output of the voltage regulator to a voltage input of circuitry of the first IC die; and
a second IC die disposed at the second surface, the second IC die having a third region comprising one or more metal layers and circuit components for one or more functions of the second IC die and a fourth region offset from the third region in a direction parallel with the second surface,
wherein the voltage regulator is further disposed at a surface of the second IC die opposite the second surface in the fourth region, and
wherein the semiconductor package includes a second conductive path conductively coupling a second output of the voltage regulator to a voltage input of circuitry in the second IC die.

15. The semiconductor package of claim 14, wherein:
the input of the voltage regulator is aligned with an offset region separating the first IC die and the second IC die at the second surface of the package substrate; and
a conductive path conductively couples a package interconnect at the first surface of the package substrate with the input of the voltage regulator, the conductive path comprising at least a through dielectric via (TDV) in a dielectric layer disposed between the voltage regulator and the second surface in the offset region.

16. The semiconductor package of claim 1, wherein the voltage regulator is an IC package mounted at the fourth surface of the first IC die.

17. The semiconductor package of claim 1, wherein the voltage regulator comprises an IC package mounted at the fourth surface of the first IC die and one or more separate discrete circuit components mounted at the fourth surface of the first IC die.

18. The semiconductor package of claim 1, wherein the voltage regulator is a set of discrete circuit components mounted at the fourth surface of the first IC die.

19. A semiconductor package comprising:
- a package substrate having a first surface and an opposing second surface;
- a three-dimensional (3D) stack of integrated circuit (IC) dies mounted at the second surface, the 3D stack comprising multiple die layers of IC dies;
- a voltage regulator mounted to a first IC die of a first die layer of the 3D stack and adjacent to a second IC die of a second die layer of the 3D stack in a direction parallel to the second surface;
- a set of first conductive paths conductively coupling one or more outputs of the voltage regulator to an IC of the first IC die, an IC of the second IC die, or both; and
- a second conductive path conductively coupling an input of the voltage regulator to a package interconnect disposed at the first surface of the package substrate through at least the first IC die and the package substrate, the second conductive path comprising a through silicon via (TSV) that traverses the first IC die by extending through the first IC die and conductively couples the package interconnect to the input of the voltage regulator.

20. The semiconductor package of claim 19, wherein the set of first conductive paths includes at least one conductive path using a frontside metal layer of the first die.

21. The semiconductor package of claim 19, wherein the set of first conductive paths includes at least one conductive path using a backside metal layer of the first IC die.

22. The semiconductor package of claim 19, wherein the set of first conductive paths includes at least one conductive path using a metal layer of the package substrate that extends laterally between the first IC die and the second IC die.

23. A semiconductor package comprising:
- a package substrate having a first surface and an opposing second surface;
- a three-dimensional (3D) stack of integrated circuit (IC) dies mounted at the second surface, the 3D stack comprising multiple die layers of IC dies;
- a voltage regulator mounted to a first IC die of a first die layer of the 3D stack and adjacent to a second IC die of a second die layer of the 3D stack in a direction parallel to the second surface;
- a set of first conductive paths conductively coupling one or more outputs of the voltage regulator to circuitry of one or both of the first IC die or the second IC die; and
- a second conductive path conductively coupling an input of the voltage regulator to a package interconnect disposed at the first surface of the package substrate through at least the first IC die and the package substrate,
- wherein the voltage regulator further is mounted to a third IC die of the first die layer,
- wherein the set of first conductive paths includes a conductive path that conductively couples one or more outputs of the voltage regulator to circuitry of the third IC die, and
- wherein the second conductive path comprises at least one of:
  - a through dielectric via (TDV) in a dielectric layer disposed between the voltage regulator and the second surface in an offset region separating the first IC die and the third IC die at the second surface of the package substrate, or
  - a through silicon via (TSV) in a silicon layer disposed in the offset region.

* * * * *